(12) United States Patent
Wu et al.

(10) Patent No.: US 8,948,182 B1
(45) Date of Patent: Feb. 3, 2015

(54) METHOD AND SYSTEM FOR VERIFICATION

(71) Applicant: Marvell International Ltd., Hamilton (BM)

(72) Inventors: Fei Wu, Beijing (CN); Hugh Walsh, Los Gatos, CA (US)

(73) Assignee: Marvell International Ltd., Hamilton (BM)

( * ) Notice: Subject to any disclaimer, the term of this patent is extended or adjusted under 35 U.S.C. 154(b) by 121 days.

(21) Appl. No.: 13/664,866

(22) Filed: Oct. 31, 2012

Related U.S. Application Data

(60) Provisional application No. 61/557,245, filed on Nov. 8, 2011.

(51) Int. Cl.
*G06F 9/45* (2006.01)

(52) U.S. Cl.
USPC .......................................................... 370/392

(58) Field of Classification Search
None
See application file for complete search history.

(56) References Cited

U.S. PATENT DOCUMENTS

| | | | |
|---|---|---|---|
| 6,771,606 B1* | 8/2004 | Kuan | 370/248 |
| 2005/0102640 A1* | 5/2005 | Iwamoto et al. | 716/4 |
| 2012/0075991 A1* | 3/2012 | Sugita et al. | 370/235 |
| 2012/0170590 A1* | 7/2012 | Chung et al. | 370/412 |
| 2012/0195198 A1* | 8/2012 | Regan | 370/235 |

OTHER PUBLICATIONS

Seifert, R., et al., "The All-New Switch Book," 2008, pp. 63-74.
Bergeron, J., et al., "Writing Testbenches Using System Verilog," 2006, pp. 295-297.
Bergeron, J., et al., "Verification Methodology Manual for System Verilog, TK7885.7 V44," 2005, p. 252.
Synopsis, Inc., VMM Scoreboarding Use Guide, Version Z-2007.06, Version 1.1.4, Jun. 13, 2007 (144 pp.).

* cited by examiner

*Primary Examiner* — John Blanton

(57) ABSTRACT

Aspects of the disclosure provide a method. The method includes receiving a first processed transaction unit output from an egress port of a first design of a switching device. The first processed transaction unit corresponds to a transaction unit that enters the first design by an ingress port. The method further includes extracting a property in the first processed transaction unit, determining the ingress port based on stored property-ingress port association information, identifying a memory element configured to store processed transaction units output from a second design of the switching device based on the ingress port and the egress port, and comparing the first processed transaction unit with a second processed transaction unit from the memory element.

18 Claims, 6 Drawing Sheets

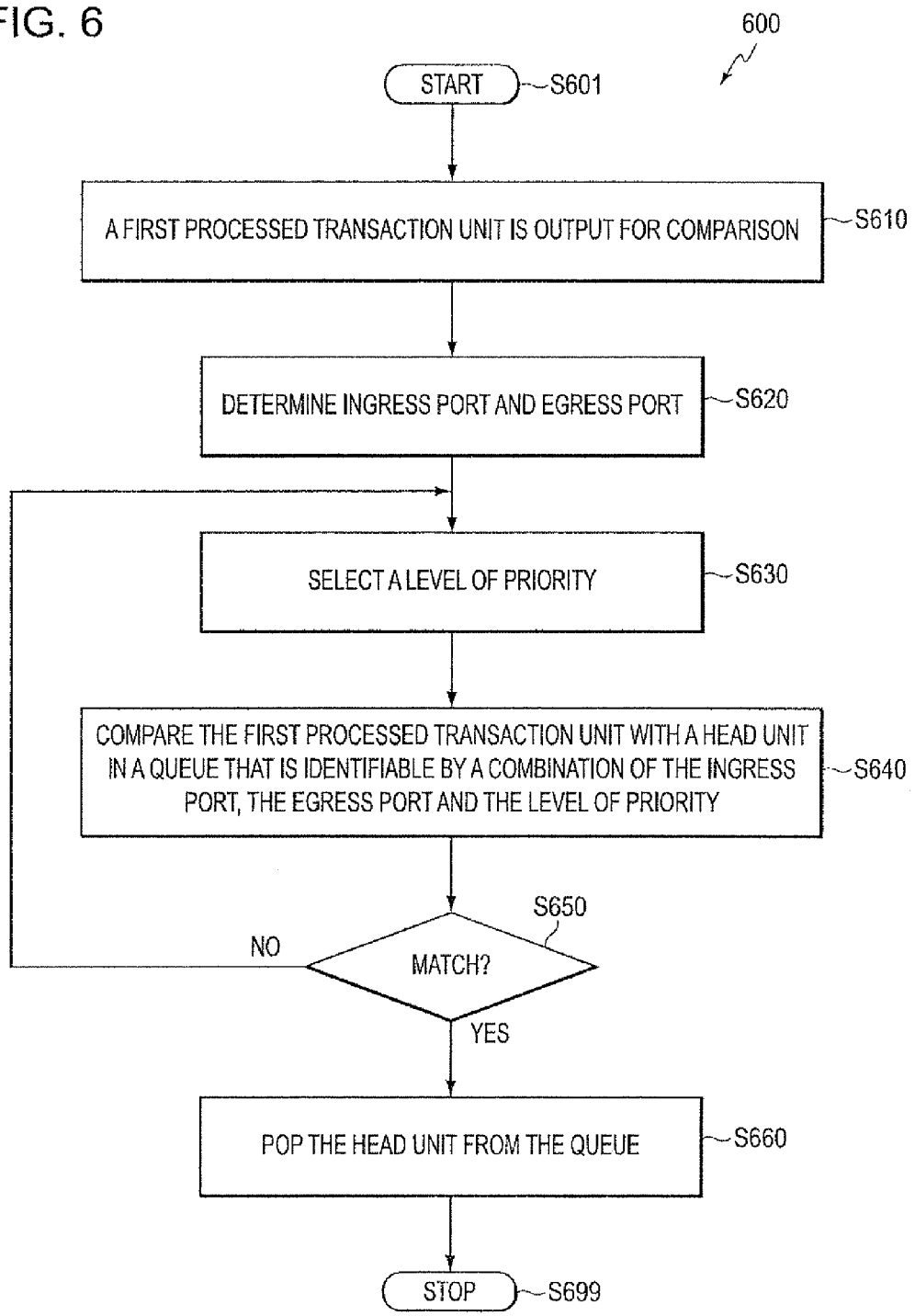

METHOD AND SYSTEM FOR VERIFICATION

INCORPORATION BY REFERENCE

This present disclosure claims the benefit of U.S. Provisional Application No. 61/557,245, "A Verification Scoreboard that Supports Multi-Function Layer, Out-of-Order and Lossy Self-Checking" filed on Nov. 8, 2011, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Generally, an integrated circuit (IC) design process includes a verification step to ensure correct implementation of an integrated circuit. In an example, a verification step asserts that two or more design representations of the integrated circuit, such as a transistor-level design, an algorithm level design, and the like, exhibit equivalent behavior.

SUMMARY

Aspects of the disclosure provide a method. The method includes receiving a first processed transaction unit output from an egress port of a first design of a switching device. The first processed transaction unit corresponds to a transaction unit that enters the first design by an ingress port. The method further includes extracting a property in the first processed transaction unit, determining the ingress port based on stored property-ingress port association information, identifying a memory element configured to store processed transaction units output from a second design of the switching device based on the ingress port and the egress port, and comparing the first processed transaction unit with a second processed transaction unit from the memory element.

In an embodiment, the property is a source address, and the method includes extracting the source address in the first processed transaction unit, and determining the ingress port based on stored source address-ingress port association information.

According to an aspect of the disclosure, the method includes extracting the property from the transaction unit, and storing the property in association with the ingress port when the transaction unit enters the first design. In an embodiment, the property in association with the ingress port is stored in a lookup table.

In an embodiment, the first processed transaction unit is stored in a queue corresponding to the egress port; and the processed transaction units output from the second design are stored in queues that are identifiable based on a combination of the respective ingress ports and egress ports.

According to an aspect of the disclosure, the first design has a lower level of abstraction than the second design. For example, the first design is at one of a register transfer level, a gate level, and a transistor level, and the second design is at an algorithm level.

According to an aspect of the disclosure, the method also includes identifying a plurality of memory elements based on the ingress port and the egress port to respectively store the processed transaction units based on levels of priority, and comparing the first processed transaction unit with one or more second processed transaction units from one or more of the plurality of memory elements.

Aspects of the disclosure provide a system. The system includes a first interface, a second interface, a third interface, and a controller. The first interface is coupled to a first design of a switching device to receive first processed transaction units output from egress ports of the first design. The first processed transaction units correspond to transaction units provided to the first design and a second design of the switching device. The second interface is coupled to the second design of the switching device to store second processed transaction units output from the second design with an indication of respective ingress ports and egress ports. The third interface is configured to store a property of a transaction unit in association with an ingress port by which the transaction unit enters the first design. The controller is configured to match a first processed transaction unit from the first interface with a second processed transaction unit from the second interface based on the stored property-ingress port association information at the third interface.

BRIEF DESCRIPTION OF THE DRAWINGS

Various embodiments of this disclosure that are proposed as examples will be described in detail with reference to the following figures, wherein like numerals reference like elements, and wherein:

FIG. 6 shows a flow chart outlining a process example 600 according to an embodiment of the disclosure.

DETAILED DESCRIPTION OF EMBODIMENTS

Figure 1:
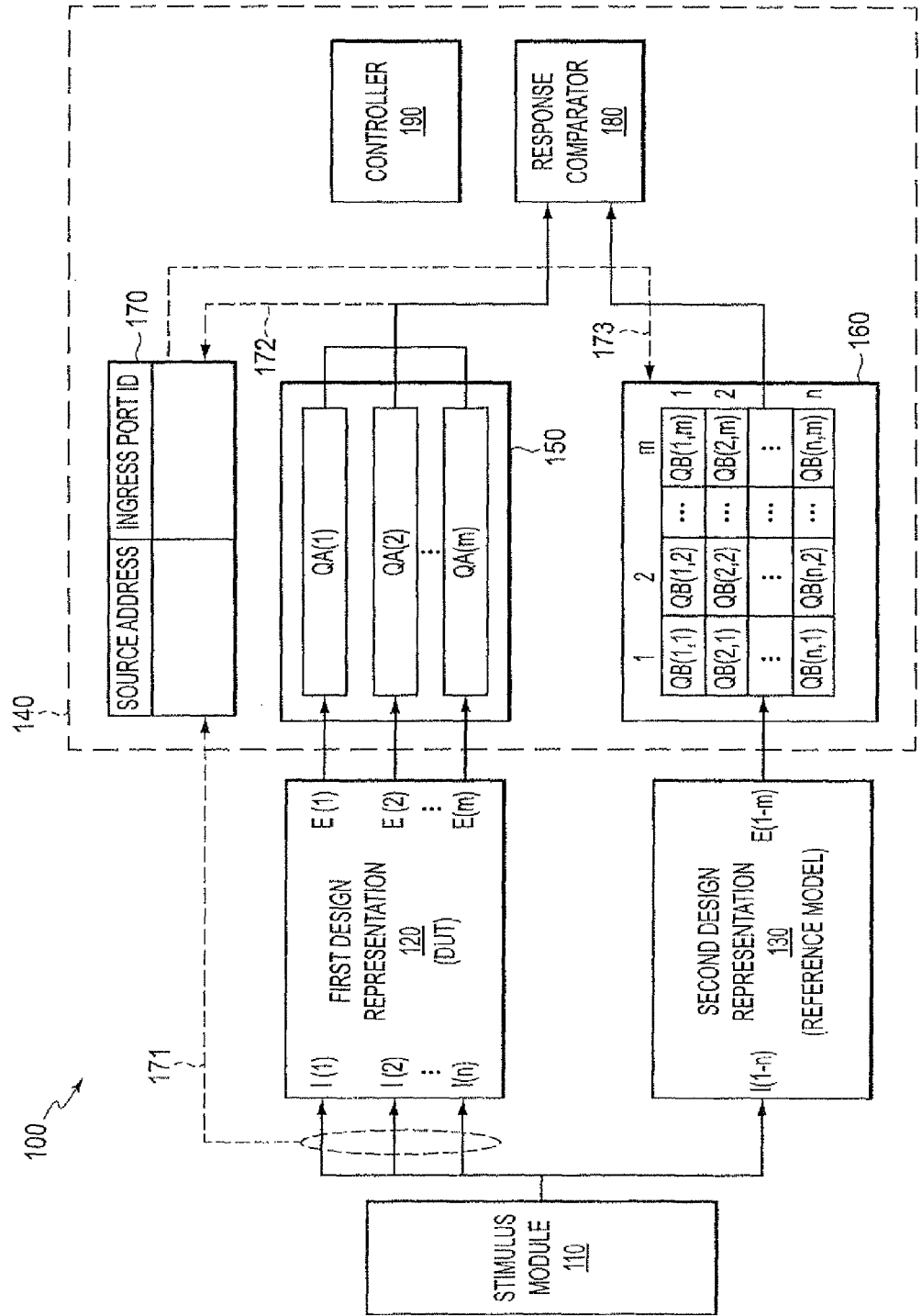
FIG. 1 shows a block diagram of a verification system example 100 according to an embodiment of the disclosure.

FIG. 1 shows a block diagram of a verification system example 100 according to an embodiment of the disclosure. The verification system 100 includes a stimulus module 110, a first design representation 120, a second design representation 130 and a scoreboard module 140. These elements are coupled together as shown in FIG. 1.

The stimulus module 110 generates suitably inputs, and provides the inputs to both the first design representation 120 and the second design representation 130. In an embodiment, the first design representation 120 and the second design representation 130 respectively simulate operations of a device, such as a packet switching device, and the like, according to different designs. The stimulus module 110 generates a plurality of transaction units, such as packets and the like, and provides the transaction units to both the first design representation 120 and the second design representation 130.

In an embodiment, the stimulus module 110 is implemented as software codes executed by one or more processors to generate the inputs. It is noted that the stimulus module 110 can be implemented using other suitable techniques. In an example, the stimulus module 110 is implemented as hardware circuits. In another example, the stimulus module 110 is implemented as a storage medium storing previously generated inputs and a medium drive that reads the storage medium. The stimulus module 110 can generate the inputs in any suitable manner, such as a random manner, a deterministic manner, a pseudo random manner, and the like.

According to an aspect of the disclosure, the first design representation 120 simulates operations of a device according to a first design, and the second design representation 130 simulates operations of the same device according to a second design. In an embodiment, the first design and the second design are designs of the device at different abstraction levels. In an example, the first design is a design under test (DUT) for the device at a relatively low abstraction level, such as at a register-transfer level (RTL), at a gate level, at a transistor level, and the like, and the second design is a reference model of the device at a relatively high abstraction level, such as at a behavior level, at an algorithm level, and the like.

It is noted that the device can be any suitable device, such as an integrated circuit, an electronic system with integrated circuit and discrete components, and the like.

Specifically, in an example, initially, features, requirements and like about the device are described in a specification. Based on the specification, a first group of designers generates the DUT as the first design, and a second group of designers generates the reference model as the second design. For example, the first group of designers generates register-transfer level (RTL) codes to implement the features, requirements and the like in the specification. The second group of designers generates C++ codes that use algorithms to implement the features, requirements and the like in the specification.

In an example, the first design is a design of a switching device at the RTL level, and the second design is a design of the switching device at the algorithm level. Specifically, the first design defines, at the RTL level, interfaces to external modules and internal operations of switching device. For example, the switching device has n (n is a positive integer) ingress ports to receive transaction units into the switching device, and has m (m is a positive integer) egress ports to output processed transaction units. The first design includes ingress port models I(1) to I(n) to respectively model the ingress ports, and egress port models E(1) to E(m) to respectively model the egress ports.

Further, the first design defines components that perform the internal operation of the switching device to process the transaction units. In an embodiment, the first design includes multiple processing paths between the ingress port models and the egress port models for processing transaction units.

It is noted that a port of a switching device can be an input/output port. For example, a port includes an ingress portion that can be modeled as an ingress port model and an egress portion that can be modeled as an egress port model.

It is also noted that the internal operations of the switching device can be any suitable operations. In an example, the internal operations include any suitable operations for switching a transaction unit, such as parsing the transaction unit, address translation, prioritizing, error detecting, scheduling, and the like.

During operation, in an embodiment, the first design representation 120 is realized as one of more processors executing the RTL codes of the first design to simulate the functions of the switching device at the RTL level. For example, to simulate the switching device, the processors execute the RTL codes to receive transaction units from the ingress port models I(1) to I(n), processes the transaction units, and drive the processed transaction units out of the egress port models E(1) to E(m).

It is noted that, in an embodiment, at the low abstraction level, the first design representation 120 can simulate a device in both functions and timings. In an example, the first design representation 120 receives two or more transaction units respectively from two or more ingress port models, and the first design representation 120 can process the two transaction units concurrently or sequentially. In another example, the first design representation 120 can receive a sequence of transaction units from an ingress port model and output the process transaction units out of order due to various reasons, such as different priority attributes of the transaction units, different processing delays, and the like.

In addition, at the low abstraction level, the first design representation 120 simulates interfaces of the device as the real device. For example, at the output side, when a processed transaction unit exits the first design representation 120, the processed transaction unit and the egress port model by which the processed transaction unit exits the first design representation 120 are visible, but the ingress port model by which the transaction unit enters the first design representation 120 may not easily available.

The second design has a relatively high abstraction level. In an embodiment, the second design is a zero-time, algorithm level reference model that does not perform timing related functions, such as delay, congestion, quality of service (QoS) overpass, and the like. The zero-time, algorithm level reference level is simpler and easier to use, and is not affected by changes to the DUT implementation.

In an example, to model the switching device, the second design has one input port model I(1-n) for receiving transaction units, and one output port model E(1-m) for outputting the processed transaction units. It is noted that, for a high abstraction level reference model, parameters can be easily added to the input and output of the reference model. For example, to simulate a transaction unit entering the switching device by an ingress port, the second design has a parameter accompanying the input port model in the input, and the parameter identifies the ingress port. Thus, when a transaction unit enters the second design by the input port model, the ingress port is identified by the parameter in the input. In another example, to simulate a processed transaction unit exiting the switching device by an egress port, the second design has a parameter accompanying the output port model in the output for identifying the egress port. In another example, the second design can include more parameters, such as a parameter for ingress port, a parameter for priority, and the like, accompanying the output port model in the output to provide more information about the processed transaction unit. It is noted that the second design defines operations on the transaction units in a single processing path from the input port model to the egress port model.

During operation, in an embodiment, the second design representation 130 is realized as one or more processors executing the codes of the second design to simulate the functions of the switching device at the relatively high abstraction level. In an example, the processor executes the algorithm codes to receive a sequence of transaction units, process the sequence of transaction units in order, and output the sequence of processed transaction units in order.

According to an aspect of the disclosure, the scoreboard module 140 collects information about the operations the first design representation 120 and the second design representation 130, such as the inputs, the responses, and the like, and keeps track of the responses. In an embodiment, the responses from the first design representation 120 and the second design representation 130 are compared to verify the implementation of the DUT.

In the FIG. 1 example, the scoreboard module 140 includes interfaces 150, 160 and 170, a response comparator 180 and a controller 190. These elements are coupled together as shown in FIG. 1.

The interface 170 is coupled to the ingress port models of the first design representation 120 to collect input information, such as ingress port information, and the like, of the first design representation 120. The interface 150 is coupled to the egress port models of the first design representation 120 to collect output information, such as responses and egress port information, and the like of the first design representation 120. The interface 160 collects the output information, such as responses, ingress port information, egress port information and the like, of the second design representation 130. The controller 190 controls the interfaces 170, 150 and 160 to provide corresponding responses from the first design representation 120 and the second design representation 130 to the response comparator 180. The response comparator 180 compares the corresponding responses from the first design representation 120 and the second design representation 130. The comparison results can be used to verify the implementation of the DUT.

According to an aspect of the disclosure, the interfaces 170, 150 and 160 include suitable memory elements, and the controller 190 suitably controls the memory elements to collect the information.

In an embodiment, the interface 160 includes memory elements that are configured as a plurality of queues QB(1,1) to QB(n, m). In an example, a queue is a first-in-first-out buffer. Each of the queues is individually identifiable by a combination of an ingress port and an egress port, and is used to queue processed transaction units that enter the second design representation 130 by the ingress port and exit the second design representation 130 by the egress port.

In the FIG. 1 example, the memory elements form an array of queues. The array has a first dimension corresponding to ingress ports, and a second dimension corresponding to egress ports. Each element in the array is a queue, and thus the queue is identifiable by an ingress port in the first dimension and an egress port in the second dimension, and is used to queue processed transaction units that enter the second design representation 130 by the ingress port and exit the second design representation 130 by the egress port. For example, QB(1, 1) is a queue for queuing processed transaction units that enter the second design representation 130 by a first ingress port and exit the second design representation 130 by a first egress port, and QB(n, m) is a queue for queuing processed transaction units that enter the second design representation 130 by an $n^{th}$ ingress port and exit the second design representation 130 by an $m^{th}$ egress port.

Further, in an embodiment, the interface 150 includes memory elements that are configured as queues QA(1) to QA(m) to respectively correspond to the egress port models of the first design that simulate the egress ports of the switching device during operation. In the FIG. 1 example, the memory elements form m queues. Each of the queues corresponds to one of the egress port models E(1) to E(m), and is used to queue processed transaction units that exit the first design representation 120 by the egress port. For example, QA(1) is a queue for queuing processed transaction units that exit the first design representation 120 by E(1); and Q(m) is a queue for queuing processed transaction units that exit the first design representation 120 by E(m).

It is noted that, in an embodiment, the output information from the first design representation 120 includes the processed transaction units and the egress port information, and does not include ingress port information. Further, in an example, it is not feasible to embed identification information in a transaction unit. In an example, a transaction unit includes multiple protocol layers, such as an Ethernet protocol layer, an IP protocol layer, a TCP protocol layer, and the like. The switching device includes functions that need to parse deeply into the protocol layers. In such example, embedding identification information in the transaction unit breaks independence between the protocol layers.

According to an aspect of the disclosure, the interface 170 includes memory elements configured to collect ingress port information. In an embodiment, the memory elements store a property of a transaction unit, such as a source address, in association with an identification of an ingress port by which the transaction unit enters the first design representation 120.

In the FIG. 1 example, the memory elements form a lookup table to store a source address of a transaction unit in association with an identification of an ingress port by which the transaction unit enters the first design representation 120. It is noted that the lookup table can be initialized, maintained and updated using any suitable technique.

The response comparator 180 compares the responses from the first design representation 120 and the second design representation 130. For example, the response comparator 180 compares a first processed transaction unit output from the first design representation 120 and a second processed transaction unit output from the second design representation 130. The first processed transaction unit and the second processed transaction unit have respectively being processed by the first design representation 120 and the second design representation 130 based on a same original transaction unit provided by the stimulus module 110.

The controller 190 controls the operations of the interfaces 170, 150 and 160 to ensure that the response comparator 180 receives two processed transaction units that are based on the same original transaction unit provided by the stimulus module 110. In an embodiment, the controller 190 is implemented as a processor executing software instructions. In another embodiment, the controller 190 is implemented using logic circuit.

During operation, in an example, the stimulus module 110 provides a transaction unit to both the first design representation 120 and the second design representation 130. The transaction unit enters the first design representation 120 from one of the ingress port models, for example, a second ingress port model I(2). The transaction unit accompanied with a parameter (e.g., has a value of 2) identifying for the ingress port enters the second design representation 130 by the input port model I(1-n).

As shown in FIG. 1 by 171, the interface 170 includes suitable components that monitor the ingress port models of the first design representation 120 and detect that the transaction unit enters the ingress port model I(2). Then, the interface 170 stores a property of the transaction unit, such as a source address and the like, in association with an identification (e.g., 2) of the ingress port.

The first design representation 120 processes the transaction unit, and outputs a first processed transaction unit from one of the egress port models E(1) to E(m), such as E(m). The interface 150 collects the first processed transaction unit, and queues the first processed transaction unit in a queue corresponding to the egress port model, such as QA(m) corresponding to E(m).

The second design representation 130 processes the transaction unit, and outputs a second processed transaction unit from its output port model E(1-m). The second design representation 130 is suitably configured that the ingress port and egress port information are output with the second processed transaction unit. The interface 160 collects the second processed transaction unit, and queues the second processed transaction unit in a queue identifiable based on a combination of the ingress port and the egress port, such as QB(2, m).

Further, in an embodiment, the controller 190 controls the response comparator 180 to compare corresponding processed transaction units from the interface 150 and the interface 160. In an example, when the interface 150 outputs a first processed transaction unit from one of the queues QA(1) to QA(m) for comparison, such as QA(m), the controller 190 extracts the property from the first processed transaction unit. In an embodiment, the property is not changed by the switching device, or the change to the property can be known, and thus the original property of the original transaction unit can be determined. In the FIG. 1 example, the source address of the first processed transaction is extracted.

Then, as shown by 172 in FIG. 1, based on the information in the interface 170, the extracted property is used to retrieve the ingress port by which the original transaction unit enters the first design representation 120. Further, based on the ingress port information obtained from the interface 170 and the egress port information from the interface 150, one of the queues in the QB(1, 1) to QB(n, m) can be identified, as shown by 173 in FIG. 1. Thus, a second processed transaction unit is output from that queue, and is provided to the response comparator 180 for comparison with the first processed transaction unit.

Figure 2:
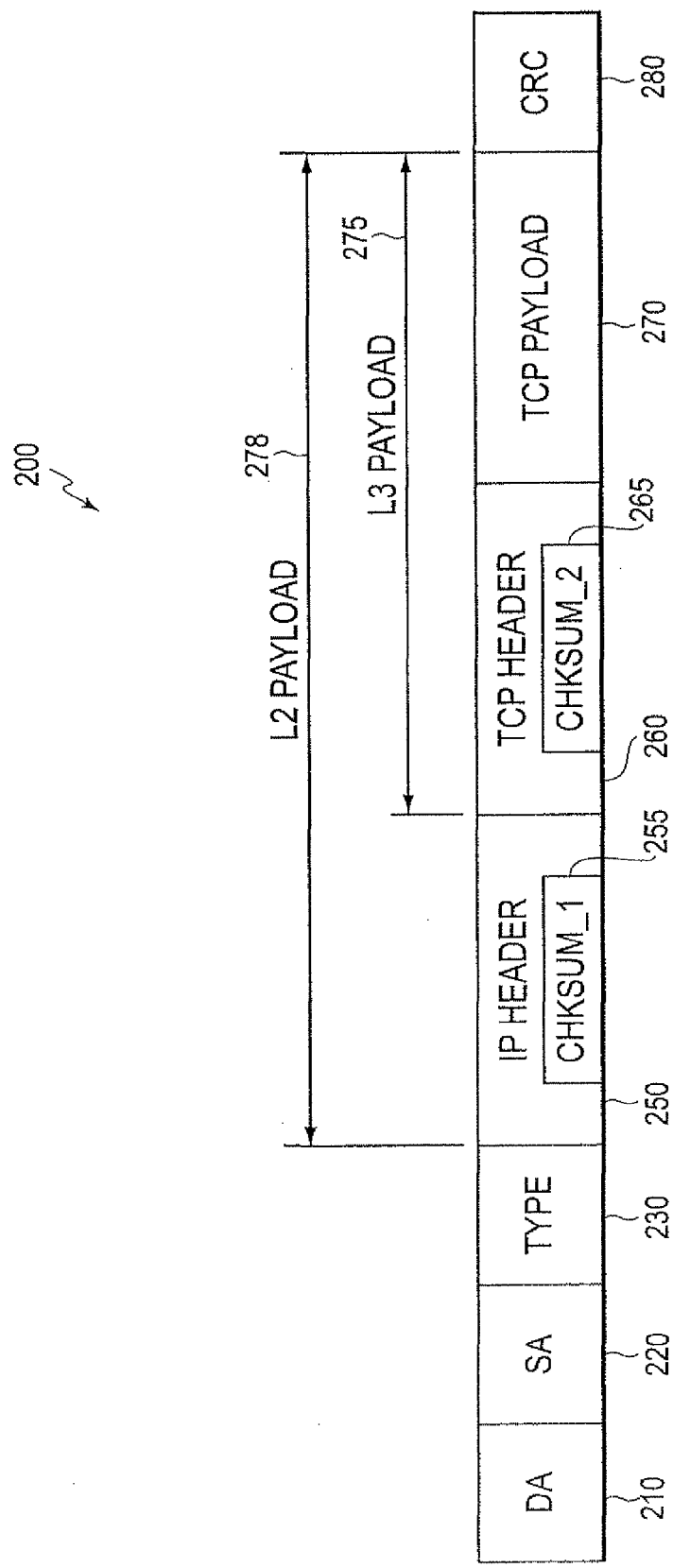
FIG. 2 shows a transaction unit example 200 according to an embodiment of the disclosure.

FIG. 2 shows a transaction unit example 200 according to an embodiment of the disclosure. In an example, the transaction unit 200 is a packet frame 200. The packet frame 200 includes a plurality of fields, such as a destination address field 210, a source address field 220, a type field 230, an L2 payload field 278, a cyclic redundancy check (CRC) code field 280, and the like. In an example, the destination address field 210 includes a 48-bit medium access control (MAC) address identifying a destination device; the source address field 220 also includes a 48-bit MAC address identifying a source device; the type field 230 indicts the type of the frame; the L2 payload field 278 includes Ethernet payload data; and the CRC code field 280 includes CRC code for error checking.

According to an aspect of the disclosure, the packet frame 200 can be a multiple-layer frame that higher level layer frame is wrapped as payload data in lower level layer frame. In the FIG. 2 example, the Ethernet payload data in the L2 payload field 278 is an IP frame that includes an IP header field 250 and an L3 payload field 275. The L3 payload field 275 includes IP payload data, and the IP header field 250 includes suitable information for IP header. For example, the IP header field 250 includes a checksum (CHKSUM_1) for IP payload data error checking.

Further, in the FIG. 2 example, the IP payload data in the L3 payload field 275 is a TCP frame that includes a TCT header field 260, and a TCP payload field 270. The TCP payload field 270 includes TCP payload data, and the TCP header field 250 includes suitable information for TCP header. For example, the TCP header field 260 includes a checksum (CHKSUM_2) for TCP payload data error checking.

According to an aspect of the disclosure, certain features of the switching device under design need to parse into the IP header and/or the TCP header. Thus, embedding packet identification information, such as serial number, and the like, in the Ethernet payload data changes the higher level layer frame, and may cause the features to not be operable, and thus causes those features to not be verifiable.

In an embodiment, the verification system 100 performs verification using multiple-layer frames 200 without embedding packet identification information in the packet frame 200. In an example, when the packet frame 200 is provided to the first design representation 120, the interface 170 stores the source address of the packet frame 200 in association with an identification of an ingress port model by which the packet frame 200 enters the first design representation 120. When the packet frame 200 is processed, and the processed packet frame is output by an egress port model of the first design representation 120, the source address is extracted from the processed packet frame and is then used to retrieve the ingress port information stored in the interface 170. The ingress port and the egress port information can be used to find the corresponding processed packet frame by the second design representation 130. Thus, the processed packet frame by the first design representation 120 and the corresponding processed packet frame by the second design representation 130 can be compared to verify the behavior of the DUT.

Figure 3:
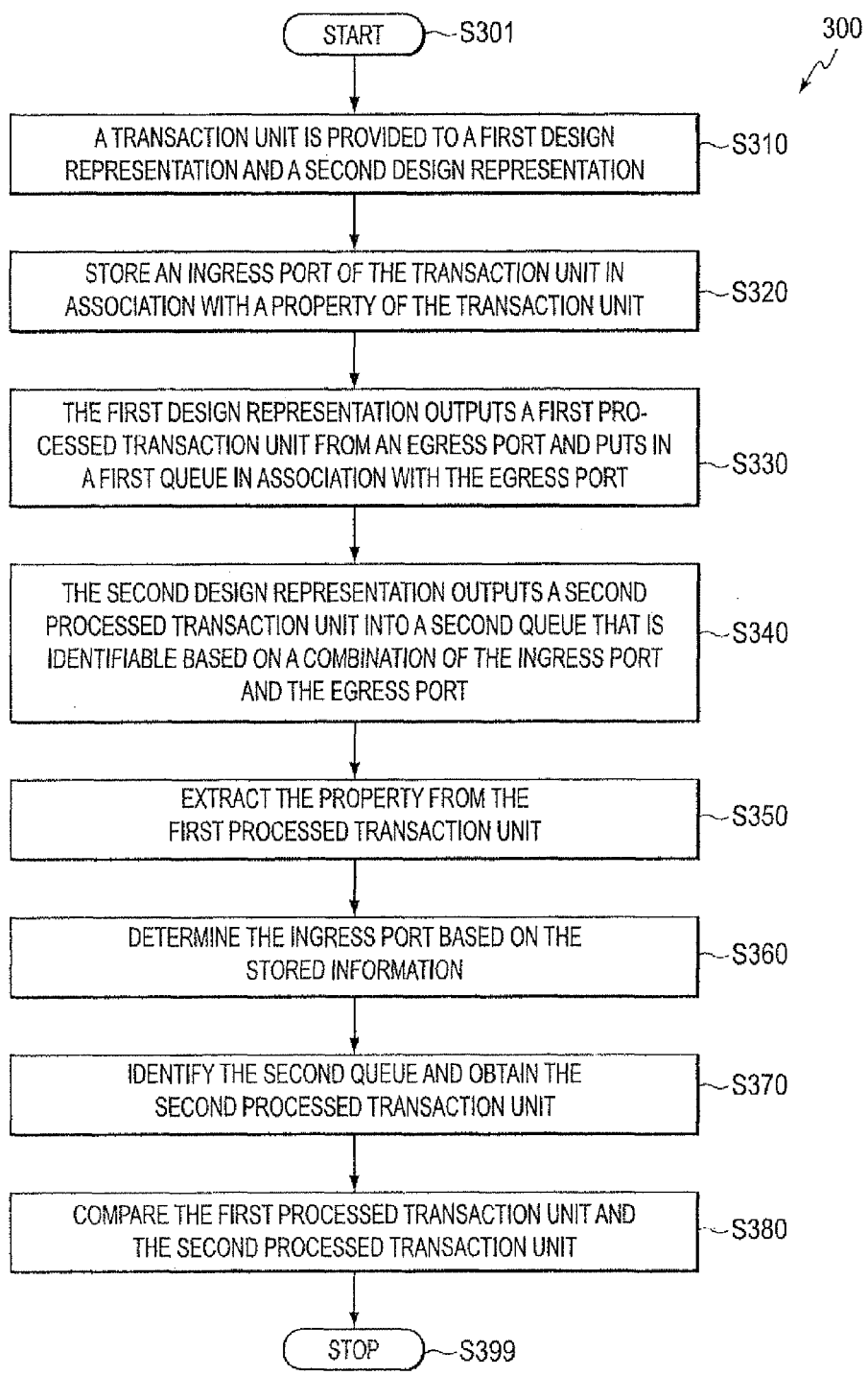
FIG. 3 shows a flow chart outlining a process example 300 according to an embodiment of the disclosure.

FIG. 3 shows a flow chart outlining a process example 300 executed in the verification system 100 according to an embodiment of the disclosure. The process starts at S301 and proceeds to S310.

At S310, a transaction unit is provided to the first design representation 120 and the second design representation 130. In an example, the stimulus module 110 generates a suitable transaction unit, such as the packet frame 200, and provides the transaction unit to both the first design representation 120 and the second design representation 130. Specifically, in an example, the transaction unit is provided to an ingress port model of the first design representation 120 to simulate that the transaction unit enters a switching device by an ingress port. Further, the transaction unit with an identification of the ingress port is provided to the second design representation 130 to simulate that the transaction enters the switching device by the ingress port.

At S320, the ingress port model by which the transaction unit enters the first design representation 120 is stored in association with a property of the transaction unit, such as the source address in the packet frame 200. In an example, the interface 170 detects the ingress port model, and stores an identification of the ingress port model in association with the source address in a lookup table.

At S330, the first design representation 120 outputs a first processed transaction unit from an egress port model, and the first processed transaction unit is stored in a first memory element corresponding to the egress port model. In an example, the interface 150 collects the first processed transaction unit into a first queue corresponding to the egress port model.

At S340, the second design representation 130 outputs a second processed transaction unit, and the second processed transaction unit is stored in a second memory element that is identifiable based on a combination of the ingress port information and the egress port information. In an example, the second design representation 130 uses algorithms to determine the egress port, and output the second processed transaction unit with an identification of the egress port and the identification of the ingress port. Thus, the interface 160 collects the second processed transaction unit into a second queue that is identifiable based on a combination of the ingress port and the egress port.

At S350, the property is extracted from the first processed transaction unit. In an example, when the first processed transaction unit is provided to the response comparator 180 from the queue corresponding to the egress port model of the first design representation, the controller 190 extracts the source address from the first processed transaction unit.

At S360, the ingress port information is determined based on the stored information. In an example, the controller 190 checks the lookup table in the interface 170 to look for the source address, and then retrieves the identification of the ingress port stored in association with the source address.

At S370, the second memory element is identified based on a combination of the ingress port and the egress port, and the second processed transaction unit is obtained from the second memory element. In an example, a queue in the interface 160 is identified based on the ingress port and the egress port. The queue outputs a processed transaction unit, and provides the processed transaction unit as the second processed transaction unit corresponding to the first processed transaction unit to the response comparator 180.

At S380, the first processed transaction unit is compared with the second processed transaction unit. The results can be used to verify the behavior of the first design representation 120 and the second design representation 130. Then, the process proceeds to S399 and terminates.

It is noted that the process 300 can be suitably modified. In an example, S330 and S340 are executed concurrently or in a different order by the first design representation 120 and the second design representation 130.

Figure 4:
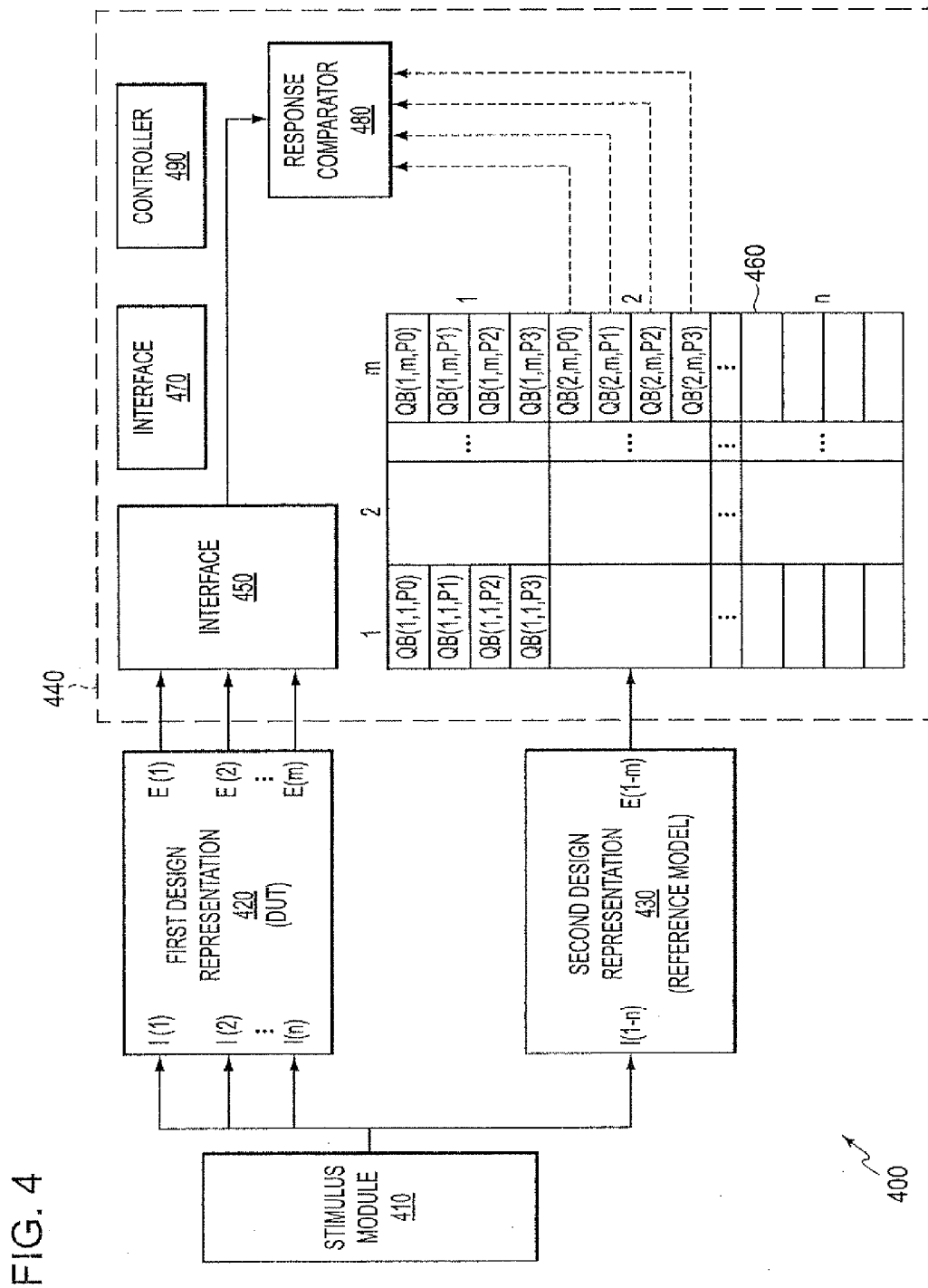
FIG. 4 shows a block diagram of another verification system example 400 according to an embodiment of the disclosure.

FIG. 4 shows a block diagram of another verification system example 400 according to an embodiment of the disclosure. The verification system 400 utilizes certain components that are identical or equivalent to those used in the verification system 100. For example, the stimulus module 410 is identical or equivalent to the stimulus module 110, the interface 450 is identical or equivalent to the interface 150, and the interface 470 is identical or equivalent to the interface 170. The controller 490 is configured similarly to the controller 190. The first design representation 420 is similarly configured as the first design representation 120. The second design representation 430 is similarly configured as the second design representation 130. The description of these components has been provided above and will be omitted here for clarity purposes.

The interface 460 includes memory elements that are configured as a plurality of queues. Each of the queues is identifiable by a combination of an ingress port, an egress port and a level of priority, and is used to queue processed transaction units that enter the second design representation 130 by the ingress port, exit the second design representation 130 by the egress port, and have the level of priority.

In the FIG. 4 example, the queues form an array. The array has a first dimension corresponding to ingress ports, a second dimension corresponding to egress ports, and a third dimension corresponding to levels of priority. Each element in the array is a queue, and thus the queue is identifiable by an ingress port in the first dimension, an egress port in the second dimension, and a level of priority in the third dimension, and is used to queue processed transaction units that enter the second design representation 430 by the ingress port, exit the second design representation 430 by the egress port, and have the level of priority.

According to an embodiment of the disclosure, a switching device uses a limited number of priority levels. For example, an Ethernet switching device could use four levels of priority, such as P0, P1, P2 and P3. In the FIG. 4 example, QB(1, 1, P0) is a queue for queuing processed transaction units that enter the second design representation 430 by a first ingress port, exit the second design representation 430 by a first egress port, and have the P0 level of priority. QB(n, m, P3) is a queue for queuing processed transaction units that enter the second design representation 430 by an $n^{th}$ ingress port, exit the second design representation 430 by an $m^{th}$ egress port, and have the P3 level of priority.

In an embodiment, the second design representation 430 is a zero-time, algorithm level reference model that does not perform timing related functions, such as delay, congestion, quality of service (QoS) overpass, and the like. Thus, transaction units are processed and output in the same order as the transaction units enter the second design representation 430. However, the second design representation 430 can determine the level of priority for the transaction units, and output the priority information with the processed transaction units. Thus, the processed transaction units are queued based on ingress port, egress port and the level of priority.

According to an aspect of the disclosure, the switching device under design has certain features that are timing related, such as delay of frames, congestion, quality of service packets overpass, and the like. The features are implemented in the first design representation 420. The timing related features can cause frame loss and/or frame out of order.

Further, the verification system 400 can be used to verify those timing related features. In an example, when the interface 450 provides a first processed transaction unit to the response comparator 480 for comparison with a corresponding second processed transaction unit, the controller 490 performs similarly to the controller 190 to determine the ingress port by which the original transaction unit enters the first design representation 420 and the egress port by which the first processed transaction unit exits the first design representation 420.

Based on the ingress port information and the egress port information, a plurality of queues in the interface 460 are identified. The plurality of queues has the same ingress port and egress port, but has different levels of priority. According to an aspect of the disclosure, the second processed transaction unit is one of the processed transaction units at the head of the identified queues.

In an example, the response comparator 480 compares the first processed transaction unit with the processed transaction units at the head of the queues to find the corresponding second processed transaction unit. In the example, the response comparator 480 needs a maximum of four comparisons to find the second processed transaction unit.

Figure 5:
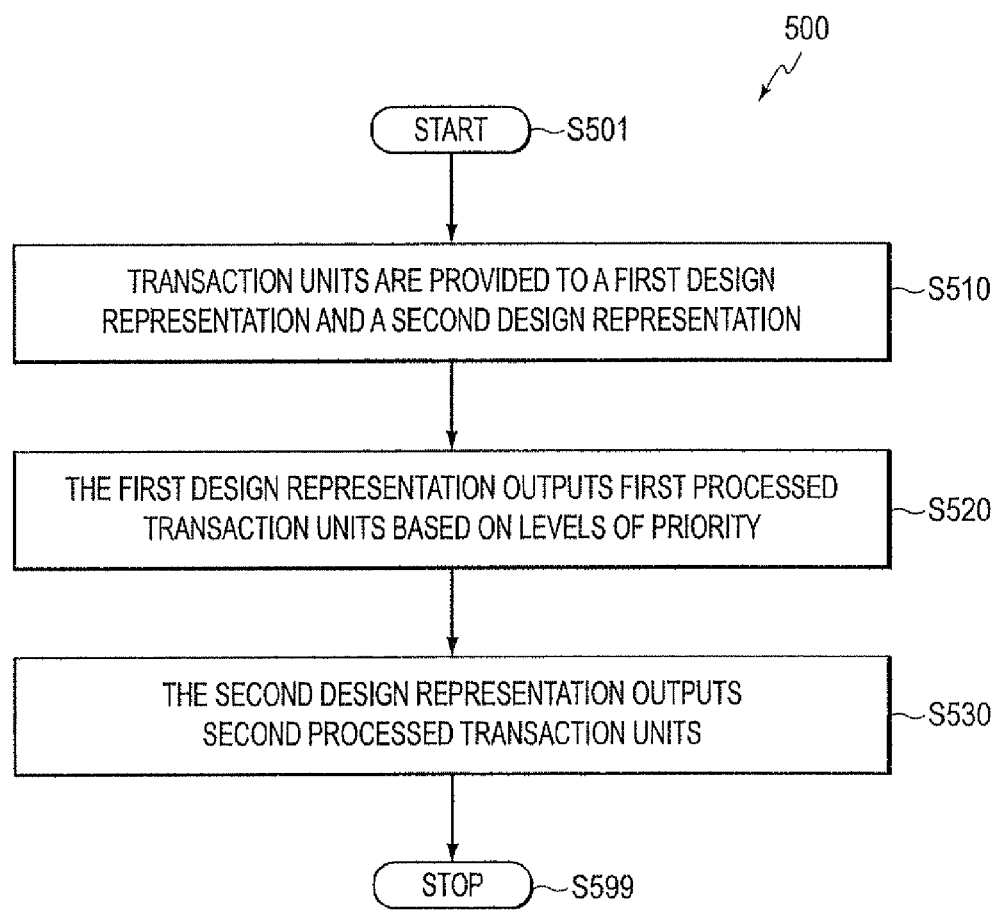
FIG. 5 shows a flow chart outlining a process example 500 according to an embodiment of the disclosure.

FIG. 5 shows a flow chart outlining a process example 500 executed by the verification system 400 to process a sequence of transaction units according to an embodiment of the disclosure. The process starts at S501 and proceeds to S510.

At S510, transaction units are provided to the first design representation 420 and the second design representation 430. In an example, the stimulus module 410 generates a sequence of transaction units, such as a sequence of the packet frames 200, and provides the transaction units to both the first design representation 420 and the second design representation 430. Specifically, in an example, a transaction unit is provided to an ingress port model of the first design representation 420 to simulate that the transaction unit enters a switching device by an ingress port. Further, the transaction unit with an identification of the ingress port is provided the second design representation 430 to simulate that the transaction enters the switching device by the ingress port.

At S520, the first design representation 420 outputs first processed transaction units based on levels of priority. In an example, a first packet frame enters the first design representation 420 ahead of a second packet frame. The first packet frame and the second packet frame have the same source address and destination address, but have different levels of priority. For example, the first packet frame has a relatively low level of priority, and the second packet frame has a relatively high level of priority. The first design representation 420 outputs the second processed packet frame ahead of the first processed packet frame.

At S530, the second design representation 430 processes the sequence of transaction units in order, determines the levels of priority for the processed transaction units, and outputs the sequence of the processed transaction units with respective levels of priority. The interface 460 queues the sequence of the transaction units based on the priority. For example, the second design representation 430 processes the first packet frame and the second packet frame in order. The second design representation 430 outputs the first processed packet frame with a first level of priority, and then outputs the second processed packet frame with a second level of priority. The first level of priority is lower than the second level of priority. The interface 460 queues the first processed packet frame and the second processed packet frame into different queues having different levels of priority. Then the process proceeds to S599 and terminates.

FIG. 6 shows a flow chart outlining a process 600 to determine corresponding processed transaction units according to an embodiment of the disclosure. The process starts at S601, and proceeds to S610.

At S610, a first processed transaction unit is output for comparison. In an example, the interface 450 outputs the first processed transaction unit.

At S620, the ingress port model by which the original transaction unit enters the first design representation 420 and the egress port model by which the first processed transaction unit exits the first design representation 420 are determined. In an example, the scoreboard 440 uses the same technique that is used in the scoreboard 140 to determine the ingress port model and the egress port model.

At S630, a level of priority is selected.

At S640, the first processed transaction unit is compared with a head unit in a queue that is identifiable by a combination of the ingress port information, the egress port information, and the level of priority.

At S650, when the head unit is determined to be the corresponding processed transaction unit to the first processed transaction unit, the process proceeds to S660; otherwise, the process returns to S630 to select a different level of priority.

At S660, the head unit is popped out the queue and is used as the corresponding second processed transaction unit to the first processed transaction unit. The first and second processed transaction units are compared to verify the behavior of the first design representation 420 and the second design representation 430. Then, the process proceeds to S699 and terminates.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A method, comprising:
    detecting a transaction unit that enters through an ingress port of a plurality of ingress ports of a first design of a switching device:
    storing a source address of the transaction unit in association with the ingress port:
    receiving a first processed transaction unit output from an egress port of a plurality of egress ports of the first design that are not the ingress ports, the first processed transaction unit corresponding to the transaction unit;
    identifying a memory element configured to store processed transaction units output from a second design of the switching device based on the ingress port and the egress port; and
    comparing the first processed transaction unit with a second processed transaction unit from the memory element.

2. The method of claim 1, further comprising:
    extracting the source address in the first processed transaction unit; and
    determining the ingress port based on the stored source address in association with the ingress port.

3. The method of claim 1, further comprising:
    extracting the source address from the transaction unit.

4. The method of claim 1, further comprising:
    determining the ingress port in association with the source address based on the stored source address in association with the ingress port in a look-up table.

5. The method of claim 1, wherein receiving the first processed transaction unit output from the egress port of the first design of the switching device further comprises:
    receiving the first processed transaction unit from a queue corresponding to the egress port.

6. The method of claim 2, wherein identifying the memory element configured to store the processed transaction units output from the second design of the switching device based on the ingress port and the egress port further comprises:
    identifying a queue based on a combination of the determined ingress port and the egress port.

7. The method of claim 1, wherein receiving the first processed transaction unit output from the egress port of the first design of the switching device further comprises:
    receiving the first processed transaction unit output from the egress port of the first design, that has a lower level of abstraction than the second design.

8. The method of claim 1, wherein receiving the first processed transaction unit output from the egress port of the first design of the switching device further comprises:
    receiving the first processed transaction unit output from the egress port of the first design at at least one of a register transfer level, a gate level, and a transistor level.

9. The method of claim 1, further comprising:
    verifying behavior of the first design and the second design based on the comparison.

10. The method of claim 1, further comprising:
    identifying a plurality of memory elements based on the ingress port and the egress port to respectively store the processed transaction units based on levels of priority; and
    comparing the first processed transaction unit with the second processed transaction unit from one of the plurality of memory elements.

11. A system, comprising:
    a first interface to a first design of a switching device to receive first processed transaction units output from egress ports of a plurality of egress ports of the first design that are not ingress ports of the first design, the first processed transaction units corresponding to transaction units provided to the first design and a second design of the switching device;
    a second interface to the second design of the switching device to store second processed transaction units output from the second design with an indication of respective ingress ports and egress ports;

a third interface configured to detect a transaction unit that enters through an ingress port of the ingress ports of the first design, and store a source address of transaction unit in association with the ingress port; and a controller configured to match a first processed transaction unit from the first interface with a second processed transaction unit from the second interface based on the stored source address in association with the ingress port in the third interface.

12. The system of claim 11, wherein the first interface includes first queues respectively corresponding to the egress ports of the first design.

13. The system of claim 11, wherein the second interface includes second queues that are respectively identifiable by a combination of one of the ingress ports and one of the egress ports.

14. The system of claim 11, wherein the controller is configured to extract the source address in the first processed transaction unit, determine the ingress port in association with the source address based on the stored source address in association with the ingress port in the third interface.

15. The system of claim 11, wherein the third interface includes a lookup table to store the source address in association with the ingress port.

16. The system of claim 11, further comprising:
a stimulus module configured to provide the transaction units to the first design and the second design.

17. The system of claim 11, further comprising:
a comparator configured to compare the first processed transaction unit with the second processed transaction unit in order to verify behavior of the first design and the second design.

18. The system of claim 11, wherein
the second interface to the second design of the switching device is configured to store the second processed transaction units based on the ingress ports, the egress ports, and respective levels of priority; and
the controller is configured to match the first processed transaction unit with the second processed transaction unit selected from one of the levels of priority.

\* \* \* \* \*